(12) United States Patent
Ning et al.

(10) Patent No.: US 10,192,996 B2
(45) Date of Patent: Jan. 29, 2019

(54) THIN FILM TRANSISTOR, DISPLAY APPARATUS HAVING THE SAME, AND FABRICATING METHOD THEREOF

(71) Applicant: BOE TECHNOLOGY GROUP CO., LTD., Beijing (CN)

(72) Inventors: Ce Ning, Beijing (CN); Wei Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/744,954

(22) PCT Filed: Mar. 6, 2017

(86) PCT No.: PCT/CN2017/075753
§ 371 (c)(1),
(2) Date: Jan. 15, 2018

(87) PCT Pub. No.: WO2017/185879
PCT Pub. Date: Nov. 2, 2017

(65) Prior Publication Data
US 2018/0212059 A1    Jul. 26, 2018

(30) Foreign Application Priority Data
Apr. 28, 2016  (CN) .......................... 2016 1 0278253

(51) Int. Cl.
*H01L 29/78*  (2006.01)
*H01L 29/786*  (2006.01)
(Continued)

(52) U.S. Cl.
CPC ........ *H01L 29/7869* (2013.01); *G02F 1/1362* (2013.01); *H01L 21/0273* (2013.01);
(Continued)

(58) Field of Classification Search
CPC ............ G02F 1/1362; H01L 21/02565; H01L 27/1225; H01L 27/1288; H01L 29/24;
(Continued)

(56) References Cited

U.S. PATENT DOCUMENTS

2009/0236597 A1    9/2009  Ye
2012/0292610 A1*  11/2012  Wang ................ H01L 29/42384
257/43
(Continued)

FOREIGN PATENT DOCUMENTS

| CN | 103500764 A | 1/2014 |
| CN | 103730346 A | 4/2014 |
| CN | 105702586 A | 6/2016 |

OTHER PUBLICATIONS

International Search Report & Written Opinion dated Jun. 15, 2017, regarding PCT/CN2017/075753.

*Primary Examiner* — Allan R Wilson
(74) *Attorney, Agent, or Firm* — Intellectual Valley Law, P.C.

(57) ABSTRACT

The present application discloses a thin film transistor including a base substrate; an active layer on the base substrate having a channel region, a source electrode contact region, and a drain electrode contact region; an etch stop layer on a side of the channel region distal to the base substrate covering the channel region; a source electrode on a side of the source electrode contact region distal to the base substrate; and a drain electrode on a side of the drain electrode contact region distal to the base substrate. A thickness of the active layer in the source electrode contact region and the drain electrode contact region is substantially the same as a combined thickness of the active layer in the channel region and the etch stop layer.

7 Claims, 7 Drawing Sheets

(51) Int. Cl.
| | |
|---|---|
| *G02F 1/1362* | (2006.01) |
| *H01L 21/02* | (2006.01) |
| *H01L 21/027* | (2006.01) |
| *H01L 21/425* | (2006.01) |
| *H01L 21/4763* | (2006.01) |
| *H01L 27/12* | (2006.01) |
| *H01L 29/24* | (2006.01) |
| *H01L 29/45* | (2006.01) |
| *H01L 29/66* | (2006.01) |
| *G02F 1/1368* | (2006.01) |

(52) U.S. Cl.
CPC ...... *H01L 21/02565* (2013.01); *H01L 21/425* (2013.01); *H01L 21/47635* (2013.01); *H01L 27/1225* (2013.01); *H01L 27/1288* (2013.01); *H01L 29/24* (2013.01); *H01L 29/45* (2013.01); *H01L 29/66969* (2013.01); *H01L 29/786* (2013.01); *G02F 1/1368* (2013.01)

(58) Field of Classification Search
CPC . H01L 29/45; H01L 29/66969; H01L 29/786; H01L 29/7869
See application file for complete search history.

(56) References Cited

U.S. PATENT DOCUMENTS

| | | | |
|---|---|---|---|
| 2015/0349140 A1* | 12/2015 | Wang | H01L 21/265 257/43 |
| 2016/0005870 A1 | 1/2016 | Huang et al. | |
| 2016/0013317 A1 | 1/2016 | Zhao et al. | |
| 2017/0133514 A1* | 5/2017 | Yang | H01L 29/78648 |

\* cited by examiner

THIN FILM TRANSISTOR, DISPLAY APPARATUS HAVING THE SAME, AND FABRICATING METHOD THEREOF

CROSS-REFERENCE TO RELATED APPLICATION

This application is a national stage application under 35 U.S.C. § 371 of International Application No. PCT/CN2017/075753, filed Mar. 6, 2017, which claims priority to Chinese Patent Application No. 201610278253.4, filed Apr. 28, 2016, the contents, of which are incorporated by reference in the entirety.

TECHNICAL FIELD

The present invention relates to a thin film transistor, a display apparatus having the same, and a fabricating method thereof.

BACKGROUND

Metal oxide or metal oxynitride thin film transistors have many advantages such as a higher carrier density and higher mobility, and have found a wide range of applications in display field. Moreover, the metal oxide or metal oxynitride thin film transistors have the advantages of lower manufacturing costs, higher transmittance, and higher bad gap. In recent years, the metal oxide or metal oxynitride thin film transistors are made smaller, and the display panel having such thin film transistors can achieve a higher resolution and a better display effect.

SUMMARY

In one aspect, the present invention provides a thin film transistor comprising a base substrate; an active layer on the base substrate comprising a channel region, a source electrode contact region, and a drain electrode contact region; an etch stop layer on a side of the channel region distal to the base substrate covering the channel region; a source electrode on a side of the source electrode contact region distal to the base substrate; and a drain electrode on a side of the drain electrode contact region distal to the base substrate; wherein the active layer is made of a semiconductor material comprising $M1O_aN_b$, wherein M1 is a single metal or a combination of metals, $a > 0$, and $b \geq 0$; the source electrode and the drain electrode are made of a metal material: the etch stop layer is made of a doped semiconductor material comprising $M1O_aN_b$ doped with a dopant; the doped semiconductor material being substantially resistant to an etchant for etching the metal material; and a thickness of the active layer in the source electrode contact region and the drain electrode contact region is substantially the same as a combined thickness of the active layer in the channel region and the etch stop layer.

Optionally, surfaces of the source electrode contact region and the drain electrode contact region distal to the base substrate are substantially leveled with that of the etch stop layer.

Optionally, a thickness of the etch stop layer is less than a thickness of the active layer in the channel region.

Optionally, the etch stop layer completely covers a surface of a region of the active layer between the source electrode contact region and the drain electrode contact region.

Optionally, the source electrode contact region and the drain electrode contact region are substantially free of the dopant.

Optionally, the doped semiconductor material comprises $M1O_aN_b$ doped with a dopant selected from the group consisting of tin, titanium, aluminum, tungsten, cobalt, zirconium, niobium, stibium, hafnium, tantalum, copper, magnesium, silicon, and germanium.

Optionally, the active layer is made of indium gallium zinc oxide.

Optionally, the source electrode and the drain electrode are made of copper.

In another aspect, the present invention provides a display substrate comprising the thin film transistor described herein.

In another aspect, the present invention provides a display panel comprising the display substrate described herein.

In another aspect, the present invention provides a display apparatus comprising the display panel described herein.

In another aspect, the present invention provides a method of fabricating a thin film transistor comprising an active layer having a channel region, a source electrode contact region, and a drain electrode contact region, comprising forming a semiconductor material layer comprising $M1O_aN_b$ on a base substrate; wherein M1 is a single metal or a combination of metals, $a > 0$, and $b \geq 0$; forming a conductive metal material layer on a side of the semiconductor material layer distal to the base substrate; and doping a first portion of the semiconductor material layer in a region corresponding to the channel region with a dopant thereby forming the etch stop layer, the etch stop layer being substantially resistant to an etchant for etching a metal material.

Optionally, the etch stop layer is formed on a side of the channel region distal to the base substrate; the method further comprising forming a source electrode on a side of the source electrode contact region distal to the base substrate, and forming a drain electrode on a side of the drain electrode contact region distal to the base substrate.

Optimally, subsequent to forming the semiconductor material layer and forming the conductive metal material layer, further comprising forming a first photoresist layer on a side of the conductive metal material layer distal to the semiconductor material layer, the first photoresist layer being in a region outside that corresponding to the channel region, exposing a first portion of the conductive metal material layer in a region corresponding to the channel region; removing the first portion of the conductive metal material layer in the region corresponding to the channel region to expose a first portion of the semiconductor material layer in the region corresponding to the channel region; and doping the first portion of the semiconductor material layer with a dopant thereby forming the etch stop layer, the etch stop layer being substantially resistant to an etchant for etching the metal material.

Optionally, doping the first portion of the semiconductor material layer is performed by ion implantation.

Optionally, doping the first portion of the semiconductor material layer comprises doping the first portion of the semiconductor material layer with a dopant selected from the group consisting of tin, titanium, aluminum, tungsten, cobalt, zirconium, niobium, stibium, hafnium, tantalum, copper, magnesium, silicon, and germanium.

Optionally, the method further comprises forming a second photoresist layer by removing a portion of the first photoresist layer to expose a second portion of the conductive metal material layer in a region outside those corresponding to the channel region, the source electrode contact region, and the drain electrode contact region; removing the second portion of the conductive metal material layer; removing a second portion of the semiconductor material layer in the region outside those corresponding to the channel region, the source electrode contact region, and the drain electrode contact region thereby forming the active layer; and removing the second photoresist layer thereby forming the source electrode and the drain electrode.

Optionally, removing the second portion of the conductive metal material layer and removing the second portion of the semiconductor material layer are performed in a single etching step using a wet etchant; and the etch stop layer is substantially resistant to the wet etchant.

Optionally, prior to forming the first photoresist layer, further comprising forming a photoresist material layer on a side of the conductive metal material layer distal to the base substrate; and removing a portion of the photoresist material layer to expose the first portion of the conductive metal material layer in the region corresponding to the channel region, thereby forming the first photoresist layer.

Optionally, the method comprises patterning the conductive metal material layer and the semiconductor material layer in a single patterning step to form an active layer, an etch stop layer, a source electrode, and a drain electrode.

Optionally, subsequent to forming the semiconductor material layer and forming the conductive metal material layer, further comprising forming a photoresist material layer on a side of the conductive metal material layer distal to the base substrate; exposing the photoresist material layer with a mask plate, and developing an exposed photoresist material layer to obtain a photoresist pattern having a first section in a region corresponding to the channel region, and a second section outside of the first region, the photoresist material being removed in the first section thereby forming a first photoresist layer in the second section; removing the conductive metal material layer in a region corresponding to the first section; and doping the semiconductor material layer in a region corresponding to the first section with a dopant thereby forming the etch stop layer, the etch stop layer being substantially resistant to an etchant for etching the metal material.

Optionally, the mask plate is a half-tone mask plate or a gray-tone mask plate, the second section comprises a first zone and a second zone; the first zone corresponding to the source electrode contact region and the drain electrode contact region; the second zone outside the first zone; the first zone is substantially unexposed the second zone is partially exposed, and the first section is fully exposed; and the first photoresist layer in the first zone has a thickness greater than that in the second zone.

Optionally, the method further comprises ashing the first photoresist layer to remove the first photoresist layer in the second zone thereby exposing a second portion of the conductive metal material layer in a region outside those corresponding to the channel region, the source contact region, and the drain contact region; wherein photoresist material in the first zone remains with a reduced thickness subsequent to ashing, thereby forming a second photoresist layer.

Optionally, the method further comprises treating the etch stop layer with a plasma comprising oxygen.

Optionally, subsequent to forming the etch stop layer, the method further comprises forming an insulating layer on a side of the active layer, the source electrode, and the drain electrode; and annealing the etch stop layer.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
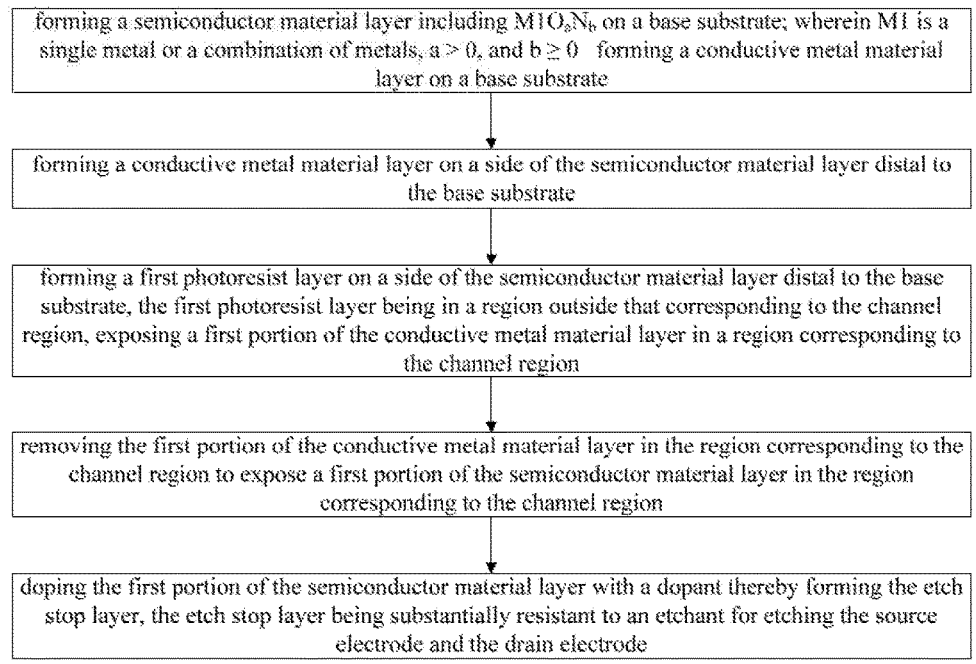
FIG. 1 is a flow chart illustrating a method of fabricating a thin film transistor in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Amorphous silicon has been widely used as the semiconductor material in conventional thin film transistors. The amorphous silicon material, however, has a bandgap of merely 1.7 V and is non-transmissive to visible light. Moreover, the amorphous silicon is a photosensitive material upon receiving visible light, it is typically required to have a metallic light shielding layer or a black matrix layer in the thin film transistor to shield the amorphous silicon from visible light irradiation. Due to these drawbacks, the amorphous silicon thin film transistor is associated with a complicated fabrication process, high manufacturing costs, a lower reliability, and a lower aperture ratio. To compensate these drawbacks, a display panel utilizing amorphous thin film transistors requires a backlight having higher light intensity, leading to a higher power consumption. Even with the sophisticated fabricating techniques developed in recent years, the mobility rate of a hydrogenated amorphous silicon can barely exceed 1 $cm^2 \cdot V^{-1} \cdot s^{-1}$. It has been more and more challenging for amorphous silicon thin film transistors to meet the demands of large size display panels and high-performance driving circuits.

Polysilicon thin film transistors are associated with problems similar to those associated with the amorphous silicon thin film transistors. Moreover, the polysilicon transistors are further involved with a higher manufacturing costs and a complicated fabricating process.

Moreover, conventional thin film transistors are typically fabricated using a plurality of patterning processes. For example, a bottom gate type thin film transistor requires at least four patterning processes, including a first patterning process for forming a gate electrode and a gate line, a second patterning process for forming a gate insulating layer, a third patterning process for forming an active layer, a fourth patterning process for thrilling an etch stop layer, and a fifth patterning process for forming a source electrode and a drain electrode. The requirement of multiple patterning process leads to a higher manufacturing cost and a lower manufacturing efficiency.

Accordingly, the present invention provides, inter alia, a thin film transistor, a display apparatus having the same, and a fabricating method thereof that substantially obviate one or more of the problems due to limitations and disadvantages of the related art. In one aspect, the present disclosure provides a thin film transistor. In some embodiments, the thin film transistor includes a base substrate; an active layer on the base substrate including a channel region, a source contact region, and a drain contact region; an etch stop layer on a side of the channel region distal to the base substrate covering the channel region; a source electrode on a side of the source electrode contact region distal to the base substrate: and a drain electrode on a side of the drain contact region distal to the base substrate. The etch stop layer is made of a doped semiconductor material doped with a dopant and is substantially resistant to an etchant for etching a metal material, e.g., an etchant for etching the source electrode and the drain electrode. Optionally, the active layer is made of a semiconductor material including $M1O_aN_b$, wherein M1 is a single metal or a combination of metals, a >0, and b≥0. Optionally, the source electrode and the drain electrode are made of a metal material. Optionally, the etch stop layer is made of a doped semiconductor material including $M1O_aN_b$ doped with a dopant; the doped semiconductor material being substantially resistant to an etchant for etching a metal material, e.g., an etchant for etching the source electrode and the drain electrode. Optionally, the active layer and the etch stop layer have substantially the same composition other than that the etch stop layer has a higher dopant concentration than that in the active layer. Optionally, the active layer and the etch stop layer are fabricated using a same semiconductor material except that the etch stop layer is doped with a dopant.

Optionally, the source contact region and the drain contact region are substantially free of the dopant. Optionally, the source contact region and the drain contact region have a concentration of the dopant element lower than that in the etch stop layer.

In some embodiments, a thickness of the active layer in the source electrode contact region and the drain electrode contact region is substantially the same as a combined thickness of the active layer in the channel region and the etch stop layer. Optionally, surfaces of the source electrode contact region and the drain electrode contact region distal to the base substrate are substantially leveled with that of the etch stop layer. Optionally, a thickness of the etch stop layer is less than a thickness of the active layer in the channel region. Optionally, the etch stop layer completely covers a surface of a region of the active layer between the source electrode contact region and the drain electrode contact region. Optionally, the etch stop layer has a dopant concentration in a range of approximately 5% by weight to approximately 20% by weight.

In another aspect, the present disclosure provides a method of fabricating a thin film transistor having a channel region, a source electrode contact region, and a drain electrode contact region. In some embodiments, the method includes forming a semiconductor material layer including $M1O_aN_b$; wherein M1 is a single metal or a combination of metals, a>0, and b≥0; forming a conductive metal material layer on a side of the semiconductor material layer distal to the base substrate; and doping a first portion of the semiconductor material layer corresponding to the channel region with a dopant thereby forming the etch stop layer, the etch stop layer being substantially resistant to an etchant for etching a metal material, e.g., an etchant for etching the source electrode and the drain electrode. The etch stop layer is formed on a side of the channel region distal to the base substrate. Optionally, the method further includes forming a source electrode on a side of the source electrode contact region distal to the base substrate, and forming a drain electrode on a side of the drain electrode contact region distal to the base substrate.

In some embodiments, the active layer, an etch stop layer, a source electrode, and a drain electrode are formed in a single patterning process. For example, the method in some embodiments includes patterning the conductive metal material layer and the semiconductor material layer in a single patterning step to form an active layer, an etch stop layer, a source electrode, and a drain electrode. By having the active layer, an etch stop layer, a source electrode, and a drain electrode formed in a single patterning process, the fabricating process is greatly simplified by reducing the number of patterning steps in fabricating the thin film transistor. Moreover, the manufacturing costs are reduced by having the single patterning process. As used herein, the term "single patterning process" refers to a patterning process using a single mask plate for fabricating one or more layers. Optionally, a single patterning process involves exposing a substrate with a single mask only once, and subsequently forming one or more layers by one or more developing steps, one or more etching steps and one or more plasma treatment steps, one or more doping steps, one or more ion implementation steps, etc.

In some embodiments, the active layer is made of a material including $M1O_aN_b$, wherein M1 is a single metal or a combination of metals, a >0, and b≥0, e.g., the active layer is made of a metal oxide material or a metal oxynitride material. Examples of appropriate metal oxide active layer materials include, but are not limited to, indium gallium zinc oxide, zinc oxide, gallium oxide, indium oxide, HfInZnO (HIZO), amorphous InGaZnO (amorphous IGZO), InZnO, amorphous InZnO, ZnO:F, $In_2O_3$:Sn, $In_2O_3$:Mo, $Cd_2SnO_4$, ZnO:Al, $TiO_2$:Nb, and Cd—Sn—O. Examples of appropriate metal oxynitride active layer materials include, but are not limited to, zinc oxynitride, indium oxynitride, gallium oxynitride, tin oxynitride, cadmium oxynitride, aluminum oxynitride, germanium oxynitride, titanium oxynitride, silicon oxynitride, or combination thereof. Optionally, the active layer is made of a material including $M1O_aN_b$ doped with one or more metal element. Optionally, the active layer is made of a material including $M1O_aN_b$ doped with one or more non-metal element. Optionally, the active layer is made of a material including $M1O_aN_b$ doped with one or more metal element and one or more non-metal element.

As used herein, the term "etch stop layer" refers to a layer that prevents etching of an underlying active layer. Optionally, the etch stop layer is substantially resistant to an etchant for etching a metal material, e.g., an etchant for etching the source electrode and the drain electrode. Optionally, the etch stop layer is substantially resistant to a wet etchant for etching a metal material, e.g., a wet etchant for etching the source electrode and the drain electrode. Optionally, the etch stop layer is made of a doped semiconductor material including $M1O_aN_b$ doped with a dopant; the doped semiconductor material being substantially resistant to an etchant for etching a metal material, e.g., an etchant for etching the source electrode and the drain electrode. The source electrode contact region and the drain electrode contact region are substantially free of the same dopant used in doping the etch stop layer, or have a lower concentration of the dopant element used in doping the etch stop layer as compared to that in the etch stop layer. Optionally, the active layer and the etch stop layer have substantially the same composition other than that the etch stop layer has a higher dopant concentration than that in the active layer. Optionally, the active layer and the etch stop layer are fabricated using a same semiconductor material except that the etch stop layer is doped with a dopant. Optionally, the doped semiconductor material includes $M1O_aN_b$ doped with one or more dopants selected from the group consisting of tin, titanium, aluminum, tungsten, cobalt, zirconium, niobium, stibium, hafnium, tantalum, copper, magnesium, silicon, and germanium.

FIG. 1 is a flow chart illustrating a method of fabricating a thin film transistor in some embodiments according to the present disclosure. Referring to FIG. 1, the method in some embodiments includes forming a conductive metal material layer on a base substrate; forming a semiconductor material layer including $M1O_aN_b$ on a side of the conductive metal material layer distal to the base substrate; wherein M1 is a single metal or a combination of metals, a>0, and b≥0; forming a first photoresist layer on a side of the semiconductor material layer distal to the base substrate, the first photoresist layer being in a region outside that corresponding to the channel region, exposing a first portion of the conductive metal material layer in a region corresponding to the channel region; removing the first portion of the conductive metal material layer in the region corresponding to the channel region to expose a first portion of the semiconductor material layer in the region corresponding to the channel region; and doping the first portion of the semiconductor material layer with a dopant thereby forming the etch stop layer, the etch stop layer being substantially resistant to an etchant for etching a metal material, e.g., an etchant for etching the source electrode and the drain electrode. Optionally, the etch stop layer is formed on a side of the channel region distal to the base substrate covering the channel region; and the source electrode contact region and the drain electrode contact region are formed to be substantially free of the dopant or have a concentration of the dopant element lower than that in the etch stop layer. Optionally, the step of doping the first portion of the semiconductor material layer is performed by ion implantation. Optionally, the step of doping the first portion of the semiconductor material layer includes doping the first portion of the semiconductor material layer with one or more dopants selected from the group consisting of tin, titanium, aluminum, tungsten, cobalt, zirconium, niobium, stibium, hafnium, tantalum, copper, magnesium, silicon, and germanium; and the source electrode contact region and the drain electrode contact region are formed to be substantially free of the dopant or have a concentration of the dopant element lower than that in the etch stop layer. Optionally, the etch stop layer has a thickness in a range of approximately 5 nm to approximately 40 nm. Optionally, the etch stop layer has a dopant concentration in a range of approximately 5% by weight to approximately 20% by weight, e.g., approximately 5% by weight to approximately 10% by weight, approximately 10% by weight to approximately 15% by weight, and approximately 15% by weight to approximately 20% by weight.

Figure 2A:
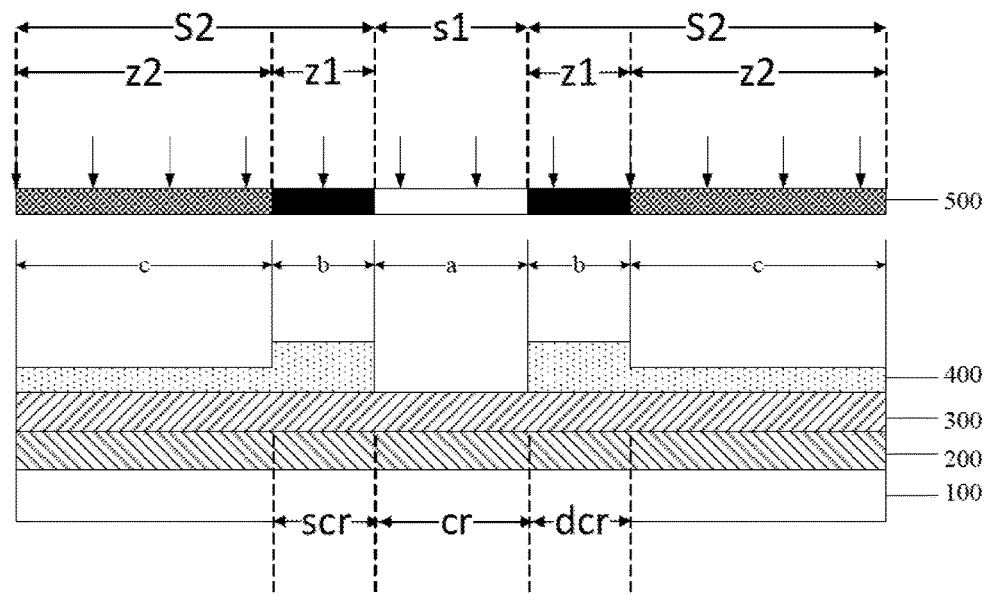
FIGS. 2A to 2F are schematic diagrams illustrating a method of fabricating a thin film transistor in some embodiments according to the present disclosure.

FIGS. 2A to 2F are schematic diagrams illustrating a method of fabricating a thin film transistor in some embodiments according to the present disclosure. Referring to FIG. 2A, the method in some embodiments includes forming a semiconductor material layer 200 including $M1O_aN_b$ on a base substrate 100; wherein M1 is a single metal or a combination of metals, a>0, and b≥0; and forming a conductive metal material layer 200 on a side of the semiconductor material layer 200 distal to the base substrate 100.

Various appropriate semiconductor materials and various appropriate fabricating methods may be used to make the semiconductor material layer 200. For example, a semiconductor material may be deposited on the substrate by magnetron sputtering, vapor deposition (e.g., plasma-enhanced chemical vapor deposition), or vacuum deposition. In some embodiments, the semiconductor material layer 200 is made of a material including $M1O_aN_b$, wherein M1 is a single metal or a combination of metals, a>0, and b≥0, e.g., the semiconductor material layer 200 is made of a metal oxide material or a metal oxynitride material. Examples of appropriate metal oxide semiconductor materials include, but are not limited to, indium gallium zinc oxide, zinc oxide, gallium oxide, indium oxide HfInZnO (HIZO), amorphous InGaZnO (amorphous IGZO), InZnO, amorphous InZnO, ZnO:F, $In_2O_3$:Sn, $In_2O_3$:Mo, $Cd_2SnO_4$, ZnO:Al, $TiO_2$:Nb, and Cd—Sn—O. Examples of appropriate metal oxynitride semiconductor materials include, but are not limited to, zinc oxynitride, indium oxynitride, gallium oxynitride, tin oxynitride, cadmium oxynitride, aluminum oxynitride, germanium oxynitride, titanium oxynitride, silicon oxynitride, or combination thereof. Optionally, the semiconductor material layer 200 is made of a material including $M1O_aN_b$ doped with one or more metal element. Optionally, the semiconductor material layer 200 is made of a material including $M1O_aN_b$ doped with one or more non-metal element. Optionally, the semiconductor material layer 200 is made of a material including $M1O_aN_b$ doped with one or more metal element and one or more non-metal element. Optionally, the semiconductor material layer 200 is made of indium gallium zinc oxide. Optionally, the semiconductor material layer 200 has a thickness in a range of approximately 30 nm to approximately 50 nm.

Various appropriate electrode materials and various appropriate fabricating methods may be used to make the conductive metal material layer 300. For example, a conductive metal material may be deposited on the substrate by magnetron sputtering, vapor deposition (e.g., plasma-enhanced chemical vapor deposition), or vacuum deposition. Examples of appropriate conductive metal materials for making the conductive metal material layer 300 include, but are not limited to, copper, titanium, tantalum, aluminum, molybdenum, chromium, and various alloys or laminates thereof. Optionally, the conductive metal material layer 300 has a single-layer structure. Optionally, the conductive metal material layer 300 has a stacked-layer structure including two or more sub-layers. Optionally, the conductive metal material layer 300 is made of a low resistance metal material. Optionally, the conductive metal material layer 300 is made of a metal material, the etchant for etching which has a low etching rate on the semiconductor material in the semiconductor material layer 200. Optionally, the conductive metal material layer 300 is made of copper (which has a low resistance and the etchant for etching copper has a relatively low etching rate on indium gallium tin oxide).

Referring to FIG. 2A, subsequent to forming the semiconductor material layer 200 and forming the conductive metal material layer 300, the method in some embodiments further includes forming a first photoresist layer 400 on a side of the conductive metal material layer 300 distal to the semiconductor material layer 200, the first photoresist layer 400 being in a region outside that corresponding to the channel region cr (see FIG. 2A, the first photoresist layer 400 is in region b and region c), exposing a first portion of the conductive metal material layer 300 in a region a corresponding to the channel region cr. For example, as shown in FIG. 2A, the first photoresist layer 400 is in region b (corresponding to the source electrode contact region scr and the drain electrode contact region dcr) and region c, but not in region a (corresponding to the channel region cr)

In some embodiments, the step of forming the first photoresist layer 400 includes forming a photoresist material layer on a side of the conductive metal material layer 300 distal to the base substrate 100; and removing a portion of the photoresist material layer to expose the first portion of the conductive metal material layer 300 in the region a corresponding to the channel region cr, thereby forming the first photoresist layer 400. In one example, the first photoresist layer 400 is formed using a mask plate 500. Optionally, the mask plate 500 is a regular mask plate. Optionally, the mask plate 500 is a half-tone mask plate or a gray-tone mask plate.

In some embodiments, the step of forming the first photoresist layer 400 includes forming a photoresist material layer on a side of the conductive metal material layer 300 distal to the base substrate 100; exposing the photoresist material layer with a mask plate 500, and developing an exposed photoresist material layer to obtain a photoresist pattern having a first section s1 in a region a corresponding to the channel region cr, and a second section s2 outside of the first region s2, the photoresist material being removed in the first section s1 thereby forming a first photoresist layer 400 in the second section s2. When the mask plate 500 is a half-tone mask plate or a gray-tone mask plate, as shown in FIG. 2A, the second section s2 includes a first zone z1 and a second zone z2. The first zone z1 corresponds to the region b (which corresponding to the source electrode contact region scr and the drain electrode contact region dcr). The second zone z2 is outside the first zone z1, and corresponds to the region c in FIG. 2A. The first zone z1 is substantially unexposed, the second zone z2 is partially exposed, and the first section S1 is fully exposed. The first photoresist layer 400 in the first zone z1 has a thickness greater than that in the second zone z2.

Figure 2B:
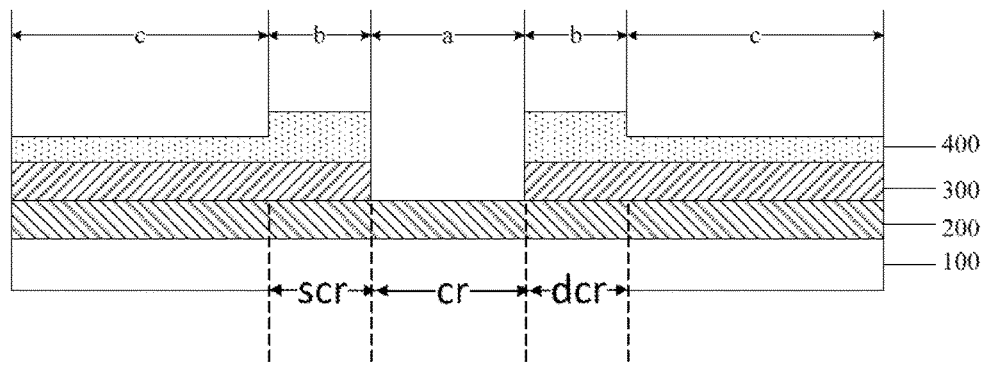

Referring to FIG. 2B, the method in some embodiments further includes removing the first portion of the conductive metal material layer 300 in the region a corresponding to the channel region cr to expose a first portion of the semiconductor material layer 200 in the region a corresponding to the channel region cr. Specifically, referring to FIGS. 2A and 2B, in some embodiments subsequent to forming the semiconductor material layer 200 and forming the conductive metal material layer 300, the method further includes forming a photoresist material layer on a side of the conductive metal material layer 300 distal to the base substrate 100; exposing the photoresist material layer with a mask plate 500, and developing an exposed photoresist material layer to obtain a photoresist pattern having a first section s1 in a region a corresponding to the channel region cr, and a second section s2 outside of the first region s2, the photoresist material being removed in the first section s1 thereby forming a first photoresist layer 400 in the second section s2, and removing the conductive metal material layer 300 in a region corresponding to the first section s1 to expose the semiconductor material layer 200 in the region a corresponding to the channel region cr.

In the step of removing the first portion of the conductive metal material layer 300 in the region a corresponding to the channel region cr, the conductive metal material layer 300 in the region a corresponding to the channel region cr is removed, however, the underlying semiconductor material layer 200 in the region a corresponding to the channel region cr is not (or at least is not substantially removed). Thus, in some embodiments, the etchant for removing the first portion of the conductive metal material layer 300 in the region a corresponding to the channel region cr is an etchant that selectively etches the conductive metal material, but not the semiconductor material (e.g., a metal oxide semiconductor material). Optionally, the etchant is hydrogen peroxide substantially free of fluorine.

Figure 2C:
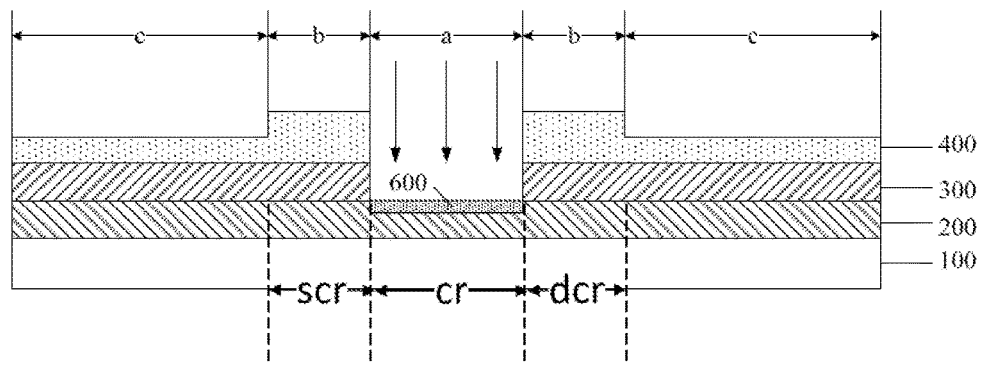

Referring to FIG. 2C, the method m some embodiments further includes doping a first portion of the semiconductor material layer 200 in the region a corresponding to the channel region cr with a dopant thereby forming the etch stop layer 600, the etch stop layer 600 being substantially resistant to an etchant for etching a metal material, e.g., an etchant for etching the source electrode and the drain electrode. Specifically, referring to FIGS. 2A to 2C, in some embodiments, subsequent to forming the semiconductor material layer 200 and forming the conductive metal material layer 300, the method further includes forming a photoresist material layer on a side of the conductive metal material layer 300 distal to the base substrate 100; exposing the photoresist material layer with a mask plate 500, and developing an exposed photoresist material layer to obtain a photoresist pattern having a first section s1 in a region a corresponding to the channel region cr, and a second section s2 outside of the first region s2, the photoresist material being removed in the first section s1 thereby forming a first photoresist layer 400 in the second section s2; removing the conductive metal material layer 300 in a region corresponding to the first section s1 to expose the semiconductor material layer 200 in the region a corresponding to the channel region cr, and doping the semiconductor material layer 200 in a region corresponding to the first section s1 with a dopant thereby forming the etch stop layer 600, the etch stop layer 600 being substantially resistant to an etchant for etching a metal material, e.g., an etchant for etching the source electrode and the drain electrode.

The doping step is performed using the first photoresist layer 400 as the mask plate. The etch stop layer 600 is formed on a side of the channel region cr distal to the base substrate 100 covering the channel region cr. The source electrode contact region scr and the drain electrode contact region dcr (e.g., corresponding to the region b in FIG. 2C) of the semiconductor material layer 200 are shielded by the first photoresist layer 400 during the doping process. Thus, the source electrode contact region scr and the drain electrode contact region dcr of the semiconductor material layer 200 are not doped by the dopant. As a result, the source electrode contact region scr and the drain electrode contact region dcr are formed to be substantially free of the dopant, or have a concentration of the dopant element lower than that in the etch stop layer 600 (e.g., in case the semiconductor material layer 200 already contains a certain amount of the dopant element prior to the doping step). Optionally, the step of doping the first portion of the semiconductor material layer 200 is performed by ion implantation. Optionally, the step of doping the first portion of the semiconductor material layer 200 includes doping the first portion of the semiconductor material layer 200 with one or more dopants selected from the group consisting of tin, titanium, aluminum, tungsten, cobalt, zirconium, niobium, stibium, hafnium, tantalum, copper, magnesium, silicon, and germanium.

Figure 2D:
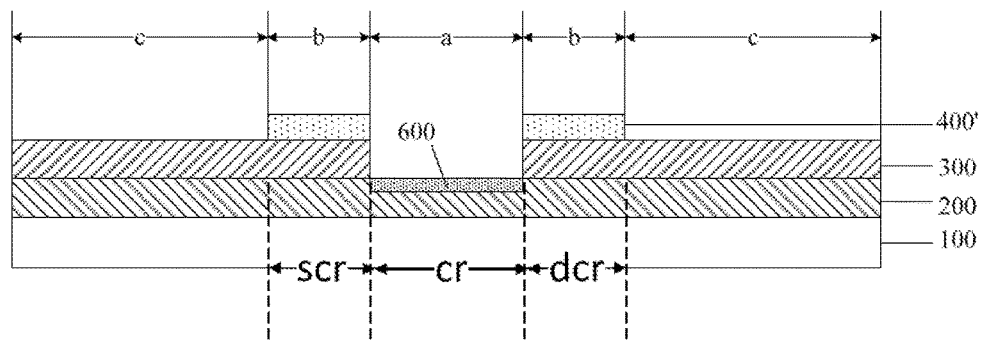

Referring to FIG. 2D, the method in some embodiments further includes forming a second photoresist layer 400' by removing a portion of the first photoresist layer 400 to expose a second portion of the conductive metal material layer in a region c outside those corresponding to the channel region cr, the source electrode contact region scr, and the drain electrode contact region dcr. For example, the region c is outside region a and region b. Various appropriate methods may be used to form the second photoresist layer 400'. In one example, the second photoresist layer 400' may be formed using a mask plate.

In some embodiments, referring to FIGS. 2A and 2D, the mask plate 500 is a half-tone mask plate or a gray-tone mask plate. The step of forming the second photoresist layer 400' includes ashing the first photoresist layer 400 to remove the first photoresist layer 400 in the second zone z2 thereby exposing a second portion of the conductive metal material layer 300 in a region c outside those corresponding to the channel region cr, the source contact region scr, and the drain contact region dcr. For example, the region c is outside region a and region b. Photoresist material in the first zone z1 remains with a reduced thickness subsequent to ashing, thereby forming a second photoresist layer 400'. The second photoresist layer 400' only remains in the region b corresponding to the source electrode contact region scr and the drain electrode contact region dcr.

Figure 2E:
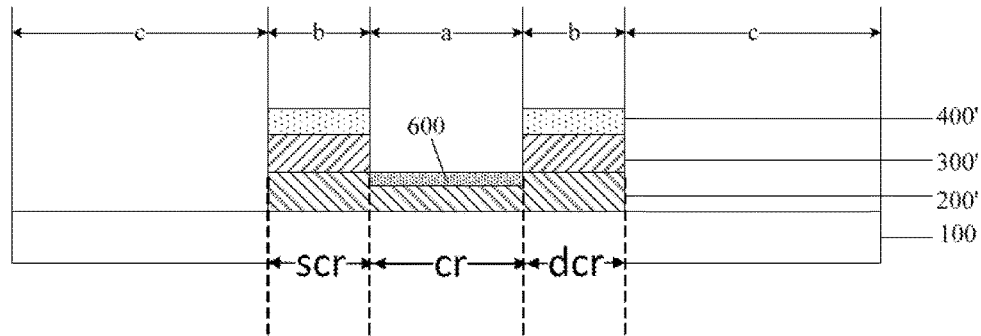

Referring to FIG. 2E, the method in some embodiments further includes removing the second portion of the conductive metal material layer 300 in the region c outside those corresponding to the channel region cr, the source electrode contact region scr, and the drain electrode contact region dcr; and removing a second portion of the semiconductor material layer 200 in the region c outside those corresponding to the channel region cr, the source electrode contact region scr, and the drain electrode contact region dcr, thereby forming the active layer 200'. Optionally, the step of removing the second portion of the conductive metal material layer 300 and the step of removing the second portion of the semiconductor material layer 200 are perform in two separate etching step using two different etchants. Optionally, the step of removing the second portion of the conductive metal material layer 300 and the step of removing the second portion of the semiconductor material layer 200 are perform in a single etching step. Optionally, the etchant for etching the second portion of the conductive metal material layer 300 and the second portion of the semiconductor material layer 200 is an etchant that can etch both the conductive metal material and the semiconductor material, e.g., an etchant including both hydrogen peroxide and fluorine.

Figure 2F:
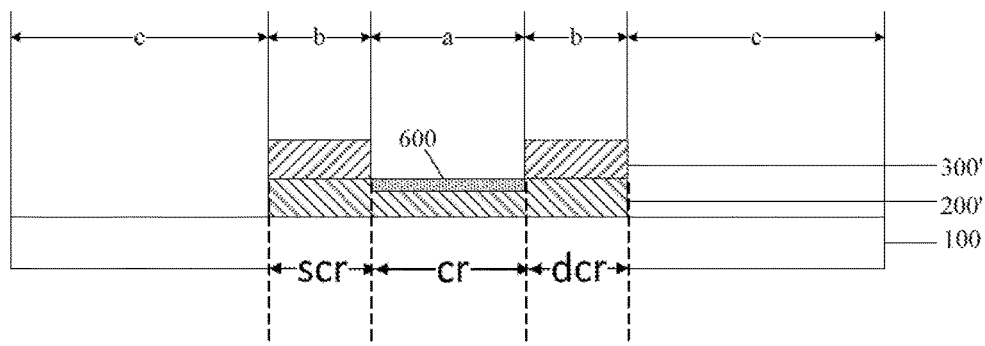

Referring to FIG. 2F, the method in some embodiments further includes removing the second photoresist layer 400' thereby forming the source electrode and the drain electrode 300'.

In the present fabricating method, an etch stop layer 600 is formed on a side of the channel region cr distal to the base substrate 100. Subsequently, the active layer 200' is formed using the etch stop layer 600 to prevent etching of the active layer 600. The etch stop layer 600 in a thin film transistor fabricated by the present method is formed by doping the semiconductor material with a dopant, e.g., by ion implantation. In essence, the etch stop layer 600 is still a semiconductor material. Even though the etch stop layer 600 is substantially not etched during the step of etching the second portion of the conductive metal material layer 300 and the second portion of the semiconductor material layer 200, the etching process may nonetheless affect its conductivity and may in some cases increase the leakage current in the thin film transistor. In some embodiments, the method further includes a step of treating the etch stop layer 600 to improve the properties of the thin film transistor. For example, the etch stop layer 600 may be treated to ensure its insulating characteristics.

Figure 3A:
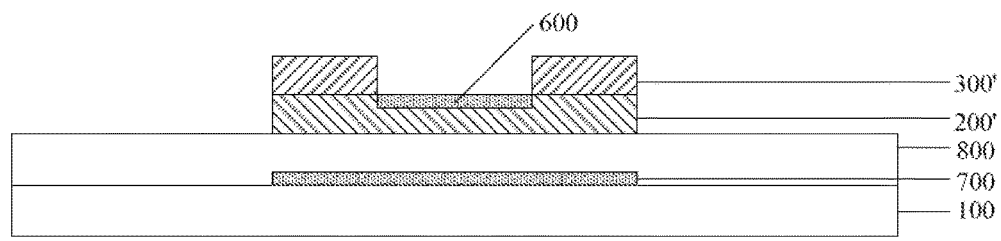
FIG. 3A is a schematic diagram illustrating the structure of a bottom gate type thin film transistor in some embodiments according to the present disclosure.

In some embodiments, the thin film transistor fabricated by the present method is a bottom gate type thin film transistor. In some embodiments, prior to forming the active layer, the etch stop layer, the source electrode, and the drain electrode, the method in some embodiments further includes forming a gate electrode on the base substrate; and forming a gate insulating layer on a side of the gate electrode distal to the base substrate. FIG. 3A is a schematic diagram illustrating the structure of a bottom gate type thin film transistor in some embodiments according to the present disclosure. Referring to FIG. 3A, the method in some embodiments further includes forming a gate electrode 700 on the base substrate 100; and forming a gate insulating layer 800 on a side of the gate electrode 700 distal to the base substrate 100. Subsequently to the step of forming the gate electrode 700 and the step of forming the gate insulating layer 800, the method further includes forming the active layer 200', the etch stop layer 600, the source electrode and the drain electrode 300' as described herein. For example, subsequent to forming the gate electrode 700 and the gate insulating layer 800, the method may further includes forming a semiconductor material layer comprising $M1O_aN_b$ on a base substrate; wherein M1 is a single metal or a combination of metals, $a>0$, and $b\geq0$; forming a conductive metal material layer on a side of the semiconductor material layer distal to the base substrate; and doping a first portion of the semiconductor material layer corresponding to the channel region with a dopant thereby forming the etch stop layer, the etch stop layer being substantially resistant to an etchant for etching a metal material, e.g., an etchant for etching the source electrode and the drain electrode. Optionally, the method further includes patterning the conductive metal material layer and the semiconductor material layer in a single patterning step to form the active layer 200', the etch stop layer 600, and the source electrode and the drain electrode 300'.

Figure 4A:
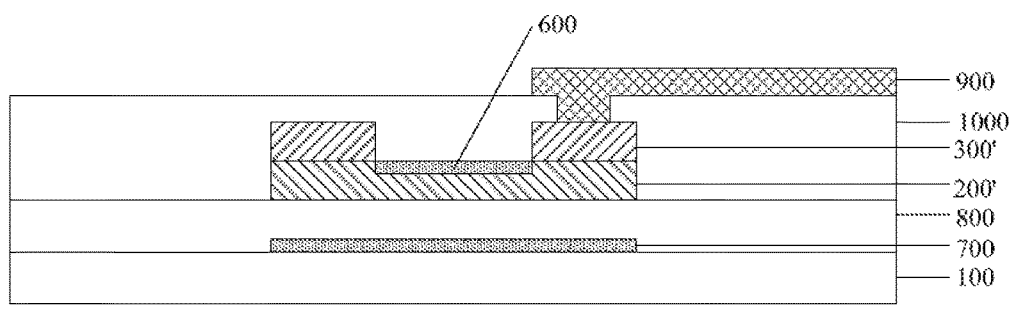
FIG. 4A is a schematic diagram illustrating the structure of an array substrate having a bottom gate type thin film transistor in some embodiments according to the present disclosure.

FIG. 4A is a schematic diagram illustrating the structure of an array substrate having a bottom gate type thin film transistor in some embodiments according to the present disclosure. Referring to FIG. 4A, subsequent to forming the active layer 200', the etch stop layer 600, and the source electrode and the drain electrode 300', the method in some embodiments further includes forming a passivation layer 1000 on a side of the etch stop layer 600, and the source electrode and the drain electrode 300' distal to the base substrate 100; and forming a via extending through the passivation layer 1000. As shown in FIG. 4A, the array substrate having the thin film transistor further includes a pixel electrode 900 on a side of the passivation layer 1000 distal to the base substrate 100, the pixel electrode 900 electrically connected to the drain electrode through the via.

In some embodiments, subsequent to forming the passivation layer 1000, the method of fabricating the thin film transistor further includes annealing the passivation layer 1000 (and the underneath etch stop layer 600) thereby repairing the defects in the etch stop layer 600 caused by the etchant during the etching process. The etch stop layer 600 treated by the annealing process has improved properties, e.g., an improved insulating characteristics. The thin film transistor having a treated etch stop layer according to the method described herein has a reduced leakage current.

In some embodiments, the method further includes treating the etch stop layer 600 with a plasma. Optionally, the step of treating the etch stop layer 600 with the plasma is performed subsequent to forming the active layer 200', the etch stop layer 600, and the source electrode and the drain electrode 300', but prior to forming the passivation layer 1000. Optionally, the step of treating the etch stop layer 600 with the plasma is performed subsequent to forming the passivation layer 1000. Optionally, the etch stop layer 600 is treated with a plasma having an oxygen-containing gas, e.g., $N_2O$ and $O_2$. The etch stop layer 600 treated by the plasma has improved properties, e.g., an improved insulating characteristics. The thin film transistor having a treated etch stop layer according to the method described herein has a reduced leakage current.

Figure 3B:
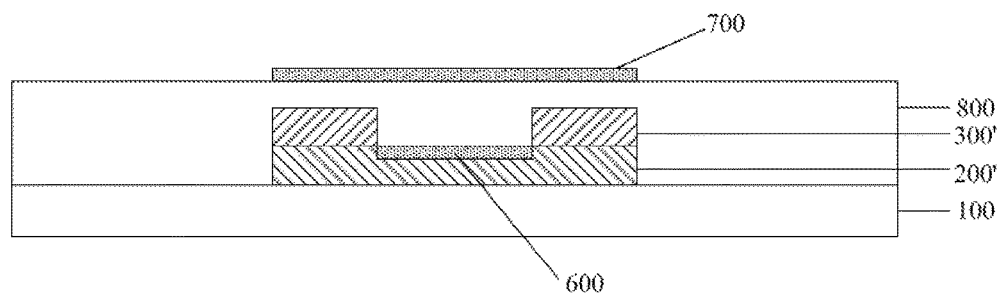
FIG. 3B is a schematic diagram illustrating the structure of a top gate type thin film transistor in some embodiments according to the present disclosure.

In some embodiments, the thin film transistor fabricated by the present method is a top gate type thin film transistor. In some embodiments, subsequent to forming the active layer, the etch stop layer, the source electrode, and the drain electrode, the method in some embodiments further includes forming a gate insulating layer on the base substrate; and forming a gate electrode on a side of the gate insulating layer distal to the base substrate. FIG. 3B is a schematic diagram illustrating the structure of a top gate type thin film transistor in some embodiments according to the present disclosure. Referring to FIG. 3B, the method in some embodiments further includes forming a gate insulating layer 800 on a side of the etch stop layer 600, and the source electrode and the drain electrode 300' distal to the base substrate 100; and forming a gate electrode 700 on a side of the gate insulating layer 800 distal to the base substrate 100. Prior to the step of forming the gate insulating layer 800 and the step of forming the gate electrode 700, the method further includes forming the active layer 200', the etch stop layer 600, the source electrode and the drain electrode 300' as described herein. For example, prior to forming the gate insulating layer 800 and the gate electrode 700, the method may further includes forming a semiconductor material layer comprising $M1O_aN_b$ on a base substrate; wherein M1 is a single metal or a combination of metals, a>0, and b≥0; forming a conductive metal material layer on a side of the semiconductor material layer distal to the base substrate; and doping a first portion of the semiconductor material layer corresponding to the channel region with a dopant thereby forming the etch stop layer, the etch stop layer being substantially resistant to an etchant for etching a metal material, e.g., an etchant for etching the source electrode and the drain electrode. Optionally, the method further includes patterning the conductive metal material layer and the semiconductor material layer in a single patterning step to form the active layer 200', the etch stop layer 600, and the source electrode and the drain electrode 300'. The gate insulating layer 800 is formed on a side of the source electrode and the drain electrode 300' distal to the base substrate 100.

Figure 4B:
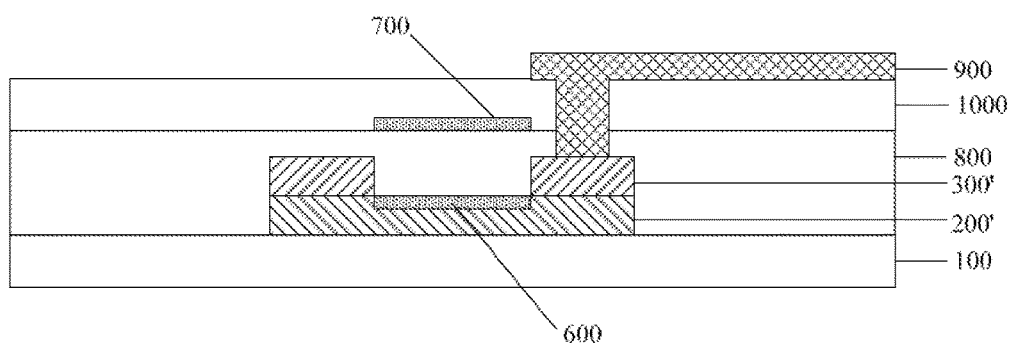
FIG. 4B is a schematic diagram illustrating the structure of an array substrate having a top gate type thin film transistor in some embodiments according to the present disclosure.

FIG. 4B is a schematic diagram illustrating the structure of an array substrate having a top gate type thin film transistor in some embodiments according to the present disclosure. Referring to FIG. 4A, subsequent to forming the gate electrode 700, the method in some embodiments further includes forming a passivation layer 1000 on a side of the gate electrode 700 distal to the base substrate 100; and forming a via extending through the passivation layer 1000 and the gate insulating layer 800. As shown in FIG. 4B, the array substrate having the thin film transistor further includes a pixel electrode 900 on a side of the passivation layer 1000 distal to the base substrate 100, the pixel electrode 900 electrically connected to the drain electrode through the via.

In some embodiments, subsequent to forming the gate insulating layer 800 (and optionally prior to forming the gate electrode 700), the method of fabricating the thin film transistor further includes annealing the gate insulating layer 800 (and the underneath etch stop layer 600) thereby repairing the defects in the etch stop layer 600 caused by the etchant during the etching process. The etch stop layer 600 treated by the annealing process has improved properties, e.g., an improved insulating characteristics. The thin film transistor having a treated etch stop layer according to the method described herein has a reduced leakage current.

In some embodiments, the method further includes treating the etch stop layer 600 with a plasma. Optionally, the step of treating the etch stop layer 600 with the plasma is performed subsequent to forming the active layer 200', the etch stop layer 600, and the source electrode and the drain electrode 300', but prior to forming the gate insulating layer 800. Optionally, the step of treating the etch stop layer 600 with the plasma is performed subsequent to forming the gate insulating layer 800. Optionally, the etch stop layer 600 is treated with a plasma having an oxygen-containing gas, e.g., $N_2O$ and $O_2$. The etch stop layer 600 treated by the plasma has improved properties, e.g., an improved insulating characteristics. The thin film transistor having a treated etch stop layer according to the method described herein has a reduced leakage current.

In another aspect, the present disclosure provides a thin film transistor fabricated by a method described herein. Optionally, the thin film transistor is a bottom gate type thin film transistor. Optionally, the thin film transistor is a top gate type thin film transistor.

In another aspect, the present disclosure provides a thin film transistor. In some embodiments, the thin film transistor includes a base substrate; an active layer on the base substrate having a channel region, a source electrode contact region, and a drain electrode contact region; an etch stop layer on a side of the channel region distal to the base substrate covering the channel region; a source electrode on a side of the source electrode contact region distal to the base substrate; and a drain electrode on a side of the chain electrode contact region distal to the base substrate. Optionally, the active layer is made of a semiconductor material including $M1O_aN_b$, wherein M1 is a single metal or a combination of metals, a>0, and b≥0. Optionally, the source electrode and the drain electrode are made of a metal material. Optionally, the etch stop layer is made of a doped semiconductor material including $M1O_aN_b$ doped with a dopant; the doped semiconductor material being substantially resistant to an etchant for etching a metal material, e.g., an etchant for etching the source electrode and the drain electrode. The source electrode contact region and the drain electrode contact region are substantially free of the dopant or have a dopant element concentration lower than that in the etch stop layer. Optionally, the doped semiconductor material includes $M1O_aN_b$ doped with one or more dopants selected from the group consisting of tin, titanium, aluminum, tungsten, cobalt, zirconium, niobium, stibium, hafnium, tantalum, copper, magnesium, silicon, and germanium.

In some embodiments, the active layer is made of a material including $M1O_aN_b$, wherein M1 is a single metal or a combination of metals, $a>0$, and $b≥0$, e.g., the active layer is made of a metal oxide material or a metal oxynitride material. Examples of appropriate metal oxide active layer materials include, but are not limited to, indium gallium zinc oxide, zinc oxide, gallium oxide, indium oxide, HfInZnO (HIZO), amorphous InGaZnO (amorphous IGZO), InZnO, amorphous InZnO, ZnO:F, $In_2O_3$:Sn, $In_2O_3$:Mo, $Cd_2SnO_4$, ZnO:Al, $TiO_2$:Nb, and Cd—Sn—O. Examples of appropriate metal oxynitride active layer materials include, but are not limited to, zinc oxynitride, indium oxynitride, gallium oxynitride, tin oxynitride, cadmium oxynitride, aluminum oxynitride, germanium oxynitride, titanium oxynitride, silicon oxynitride, or combination thereof. Optionally, the active layer is made of a material including $M1O_aN_b$ doped with one or more metal element. Optionally, the active layer is made of a material including $M1O_aN_b$ doped with one or more non-metal element. Optionally, the active layer is made of a material including $M1O_aN_b$ doped with one or more metal element and one or more non-metal element.

Optionally, the active layer is made of indium gallium zinc oxide.

Optionally, the source electrode and the drain electrode are made of copper.

In another aspect, the present disclosure provides a display substrate having a thin film transistor described herein or fabricated by a method described herein. The display substrate in some embodiments further includes a pixel electrode electrically connected to the drain electrode in the thin film transistor.

Figure 5:
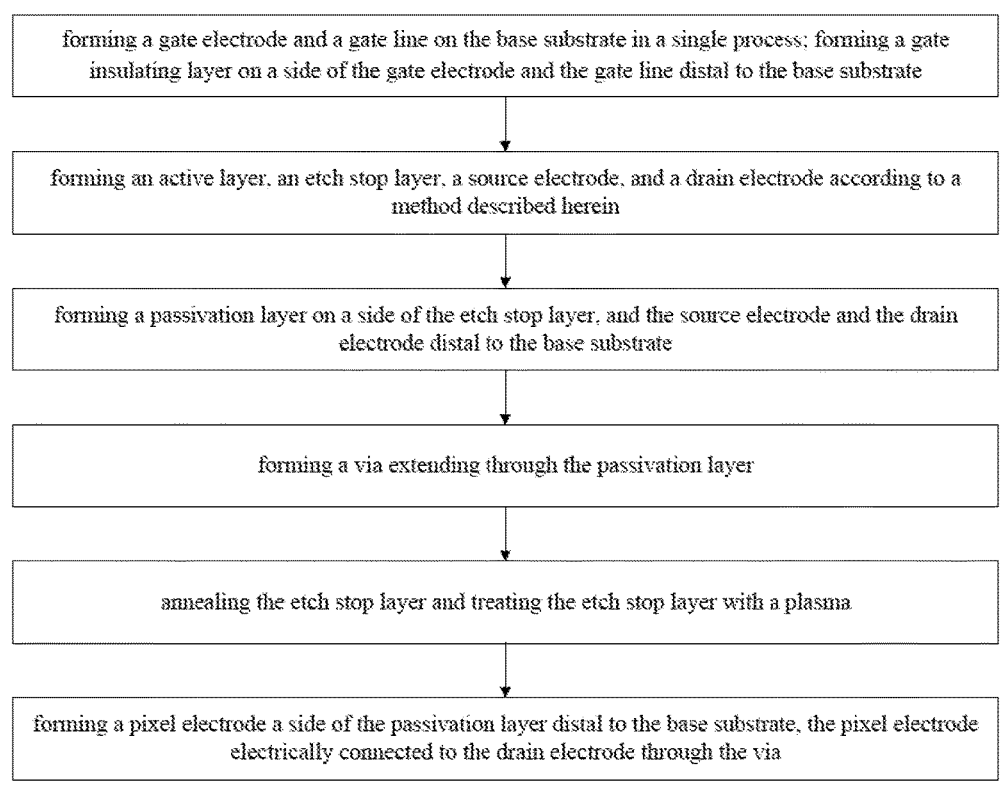
FIG. 5 is a flow chart illustrating a method of fabricating a display substrate having a bottom gate type thin film transistor in some embodiments according to the present disclosure.

In another aspect, the present disclosure provides a method of fabricating a display substrate. FIG. 5 is a flow chart illustrating a method of fabricating a display substrate having a bottom gate type thin film transistor in some embodiments according to the present disclosure. Referring to FIG. 5, the method in some embodiments includes forming a gate electrode and a gate line on the base substrate in a single process; forming a gate insulating layer on a side of the gate electrode and the gate line distal to the base substrate; forming an active layer, an etch stop layer, a source electrode, and a drain electrode according to a method described herein; forming a passivation layer on a side of the etch stop layer, and the source electrode and the drain electrode distal to the base substrate; forming a via extending through the passivation layer; annealing the etch stop layer and treating the etch stop layer with a plasma; and forming a pixel electrode a side of the passivation layer distal to the base substrate, the pixel electrode electrically connected to the drain electrode through the via.

Figure 6:
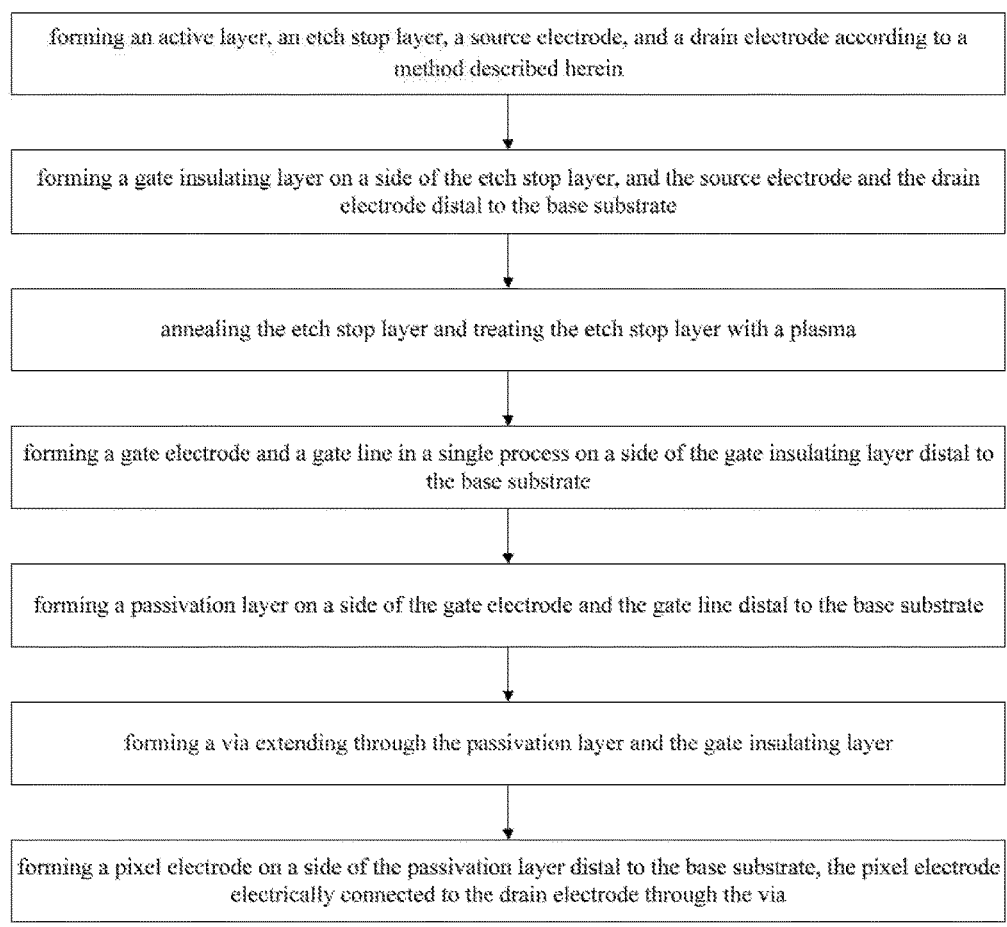
FIG. 6 is a flow chart illustrating a method of fabricating a display, substrate having a top gate type thin film transistor in some embodiments according to the present disclosure.

FIG. 6 is a flow chart illustrating a method of fabricating a display substrate having a top gate type thin film transistor in some embodiments according to the present disclosure. Referring to FIG. 6, the method in some embodiments includes forming an active layer, an etch stop layer, a source electrode, and a drain electrode according to a method described herein; forming a gate insulating layer on a side of the etch stop layer, and the source electrode and the drain electrode distal to the base substrate; annealing the etch stop layer and treating the etch stop layer with a plasma; forming a gate electrode and a gate line in a single process on a side of the gate insulating layer distal to the base substrate; forming a passivation layer on a side of the gate electrode and the gate line distal to the base substrate; forming a via extending through the passivation layer and the gate insulating layer, and forming a pixel electrode on a side of the passivation layer distal to the base substrate, the pixel electrode electrically connected to the drain electrode through the via.

In another aspect, the present disclosure provides a display panel having a display substrate described herein or fabricated by a method described herein.

In another aspect, the present disclosure provides a display apparatus having a display panel described herein. Examples of appropriate display apparatuses includes, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:
1. A thin film transistor, comprising:
a base substrate;
an active layer on the base substrate comprising a channel region, a source electrode contact region, and a drain electrode contact region;
an etch stop layer on a side of the channel region distal to the base substrate covering the channel region;
a source electrode on a side of the source electrode contact region distal to the base substrate; and
a drain electrode on a side of the drain electrode contact region distal to the base substrate;
wherein the active layer is made of a semiconductor material comprising $M1O_aN_b$, wherein M1 is a single metal or a combination of metals, $a>0$, and $b≥0$;

the source electrode and the drain electrode are made of a metal material;

the etch stop layer is made of a doped semiconductor material comprising $MlO_aN_b$ doped with a dopant; the doped semiconductor material being substantially resistant to an etchant for etching the metal material; and a thickness of the active layer in the source electrode contact region and the drain electrode contact region is substantially the same as a combined thickness of the active layer in the channel region and the etch stop layer.

2. The thin film transistor of claim 1, wherein surfaces of the source electrode contact region and the drain electrode contact region distal to the base substrate are substantially leveled with that of the etch stop layer.

3. The thin film transistor of claim 1, wherein a thickness of the etch stop layer is less than a thickness of the active layer in the channel region.

4. The thin film transistor of claim 1, wherein the etch stop layer completely covers a surface of a region of the active layer between the source electrode contact region and the drain electrode contact region.

5. The thin film transistor of claim 1, wherein the doped semiconductor material comprises $MlO_aN_b$ doped with a dopant selected from the group consisting of tin, titanium, aluminum, tungsten, cobalt, zirconium, niobium, stibium, hafnium, tantalum, copper, magnesium, silicon, and germanium.

6. The thin film transistor of claim 1, wherein the active layer is made of indium gallium zinc oxide, and the source electrode and the drain electrode are made of copper.

7. A display apparatus, comprising the thin film transistor of claim 1.

* * * * *